(12) United States Patent
Kim

(10) Patent No.: US 8,969,878 B2
(45) Date of Patent: Mar. 3, 2015

(54) SEMICONDUCTOR DEVICE AND METHOD FOR MANUFACTURING THE DEVICE

(71) Applicant: Ju-Youn Kim, Gyeonggi-do (KR)

(72) Inventor: Ju-Youn Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/733,936

(22) Filed: Jan. 4, 2013

(65) Prior Publication Data

US 2013/0299914 A1 Nov. 14, 2013

(30) Foreign Application Priority Data

May 14, 2012 (KR) ................. 10-2012-0051036

(51) Int. Cl.
| | | |
|---|---|---|
| *H01L 21/28* | (2006.01) | |
| *H01L 27/092* | (2006.01) | |
| *H01L 29/40* | (2006.01) | |
| *H01L 21/8238* | (2006.01) | |
| *H01L 29/51* | (2006.01) | |
| *H01L 27/11* | (2006.01) | |

(52) U.S. Cl.
CPC ............ *H01L 27/092* (2013.01); *H01L 29/401* (2013.01); *H01L 21/823842* (2013.01); *H01L 21/823857* (2013.01); *H01L 29/513* (2013.01); *H01L 29/517* (2013.01); *H01L 27/1104* (2013.01)
USPC .............................. 257/64; 438/150; 438/166

(58) Field of Classification Search
CPC ............ H01L 21/28194; H01L 29/513; H01L 29/517; H01L 29/518; H01L 21/28202

USPC .................. 257/411, 412, 369, 388, 903, 904
See application file for complete search history.

(56) References Cited

U.S. PATENT DOCUMENTS

| | | | |
|---|---|---|---|
| 6,563,178 B2 | 5/2003 | Moriwaki et al. | |
| 6,586,288 B2 | 7/2003 | Kim et al. | |
| 7,126,199 B2 | 10/2006 | Doczy et al. | |
| 7,785,958 B2 | 8/2010 | Doczy et al. | |
| 7,902,058 B2 | 3/2011 | Datta et al. | |
| 8,013,368 B2 | 9/2011 | Bohr | |
| 2006/0065939 A1* | 3/2006 | Doczy et al. | 257/412 |
| 2009/0102051 A1* | 4/2009 | Beyer et al. | 257/751 |
| 2010/0052074 A1* | 3/2010 | Lin et al. | 257/407 |
| 2011/0062526 A1* | 3/2011 | Xu et al. | 257/369 |
| 2011/0193181 A1* | 8/2011 | Jung et al. | 257/411 |
| 2011/0198699 A1 | 8/2011 | Hung et al. | |
| 2011/0215409 A1 | 9/2011 | Li et al. | |
| 2011/0254093 A1 | 10/2011 | Wang et al. | |
| 2012/0032332 A1* | 2/2012 | Lim et al. | 257/751 |
| 2013/0026578 A1* | 1/2013 | Tsau | 257/368 |
| 2013/0280900 A1* | 10/2013 | Lai et al. | 438/589 |

* cited by examiner

*Primary Examiner* — Steven Loke
*Assistant Examiner* — Didarul Mazumder
(74) *Attorney, Agent, or Firm* — F. Chau & Associates, LLC

(57) ABSTRACT

A semiconductor device includes a N-type field effect transistor comprising a N-channel region in a substrate. A high dielectric constant (high-k) layer is disposed on the N-channel region. A diffusion layer including a metal oxide is disposed on the high-k layer. A passivation layer is disposed on the diffusion layer, and a first metal gate is disposed on the passivation layer. The first high-k layer and the N-channel region include metal atoms of a metal element of the metal oxide.

17 Claims, 15 Drawing Sheets

SEMICONDUCTOR DEVICE AND METHOD FOR MANUFACTURING THE DEVICE

CROSS-REFERENCE TO RELATED APPLICATION

This application claims priority under 35 U.S.C. §119 to Korean Patent Application No. 10-2012-0051036 filed on May 14, 2012 in the Korean Intellectual Property Office, and the disclosure of which is incorporated by reference herein in its entirety.

TECHNICAL FIELD

The inventive concept relates to a semiconductor device and a method for manufacturing the device.

DESCRIPTION OF THE RELATED ART

Metal-oxide-semiconductor (MOS) transistors using polysilicon gate electrodes are widely known. Polysilicon gate electrodes may be annealed at a high temperature with source and drain regions. Polysilicon gate electrodes may also serve as ion implantation masks when source and drain regions are formed.

As transistors shrink, resistance of polysilicon electrodes increases, which prevents transistors from operating at high speed. Recently, integrated structures of a high dielectric constant gate oxide and a metal gate has been proposed. The introduction of new materials may cause other problems such as incompatibility of metal gates with high temperature processes and work function controls of the integrated structures. Accordingly, there is a need for an improved process for integrating a high dielectric constant gate oxide and a metal gate.

SUMMARY

According to an exemplary embodiment of the inventive concept, a semiconductor device comprises a N-type field effect transistor including a first high dielectric constant (high-k) layer disposed on a substrate. A diffusion layer including a metal oxide is disposed on the first high-k layer. A passivation layer is disposed on the diffusion layer, and a first metal gate is disposed on the passivation layer.

According to an exemplary embodiment of the inventive concept, a static random access memory (SRAM) device comprises a N-type field effect transistor and a P-type field effect transistor. The N-type field effect transistor comprises a high dielectric constant (high-k) layer disposed on a substrate. A diffusion layer including a metal oxide is disposed on the high-k layer. A passivation layer is disposed on the diffusion layer, and a first metal gate is disposed on the passivation layer. The P-type field effect transistor comprises the high-k layer disposed on the substrate.

According to an exemplary embodiment of the inventive concept, a semiconductor device comprises a N-type field effect transistor comprising a N-channel region in a substrate. A high dielectric constant (high-k) layer is disposed on the N-channel region. A diffusion layer including a metal oxide is disposed on the high-k layer. A passivation layer is disposed on the diffusion layer, and a first metal gate is disposed on the passivation layer. The first high-k layer and the N-channel region include metal atoms of a metal element of the metal oxide.

According to an exemplary embodiment of the inventive concept, a method for manufacturing a semiconductor device comprises a step where a first trench and a second trench are formed in a substrate and defined by spacers formed on a substrate. A high-k layer is formed in the first and the second trenches. A diffusion layer is formed on the high-k layer of the first trench which includes a metal oxide. A passivation layer is formed on the diffusion layer for preventing the diffusion layer from being oxidized. Metal atoms of the metal oxide are diffused into the high-k layer of the first trench and the substrate under the first trench by thermally heating the substrate. A first metal gate is formed on the passivation layer formed in the first trench.

BRIEF DESCRIPTION OF THE DRAWINGS

The above and other aspects and features of the inventive concept will become more apparent by describing in detail exemplary embodiments thereof with reference to the accompanying drawings of which.

DETAILED DESCRIPTION OF THE EMBODIMENTS

Figure 1:
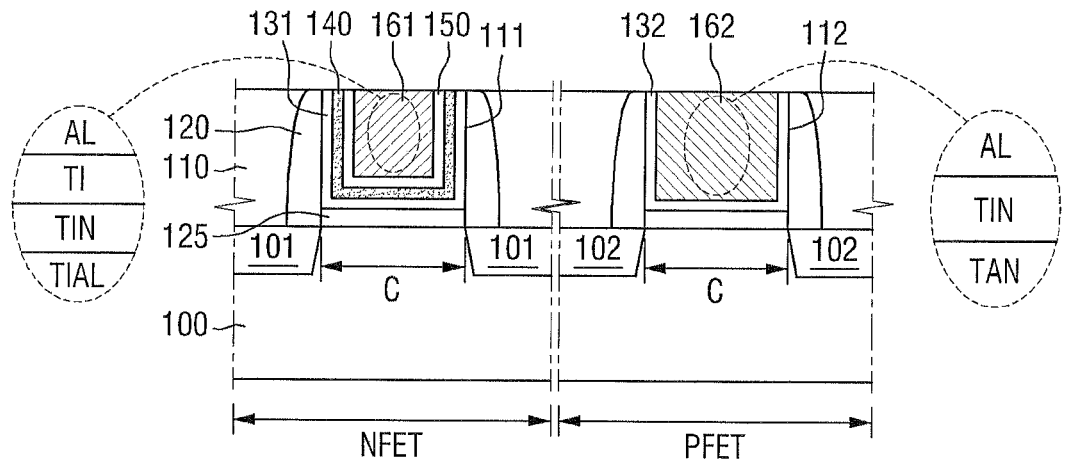
FIG. 1 is a cross-sectional view of a semiconductor device in accordance with an exemplary embodiment of the inventive concept.

Exemplary embodiments of the inventive concept will be described below in more detail with reference to the accompanying drawings. However, the inventive concept may be embodied in different forms and should not be construed as limited to the embodiments set forth herein. Rather, these exemplary embodiments are provided so that this disclosure will be thorough and complete and will fully convey the inventive concept to those skilled in the art. In the drawings, the thickness of layers and regions are exaggerated for clarity.

It will be understood that when an element or layer is referred to as being "on" another element or layer, it may be directly on the other layer or intervening layers may be present. Like numbers may refer to like elements throughout.

FIG. 1 is a cross-sectional view of a semiconductor device in accordance with an exemplary embodiment of the inventive concept.

Referring to FIG. 1, a semiconductor substrate 100 may include a first region (e.g., NFET region) and a second region (e.g., PFET region). Here, the first region NFET may be a region where an N-type field effect transistor (NFET) is formed, and the second region PFET may be a region where a P-type field effect transistor (PFET) is formed.

Each of the first and second regions NFET and PFET may include a channel region C and source/drain regions 101 and 102. Here, the channel region C of the first region NFET may be a N-channel region through which N-type carriers of the source/drain regions 101 move, and the channel region C of the second region PFET may be a P-channel region through which P-type carriers of the source/drain regions 102 move. An isolation (not shown) may be formed the outside of the source and drain regions 101 and 102 in the semiconductor substrate 100 to isolate the NFET and the PFET.

The NFET may include a first trench 111. The first trench 111 may be surrounded by spacers 120 disposed on the channel region C of NFET, and an interlayer insulating layer 110 may be formed on the outside of the spacers 120. In some embodiments of the inventive concept, the NFET may include a tensile stress layer (not shown) on the source/drain regions 101 for providing tensile stress to the channel region C of the NFET. In an embodiment according to the inventive concept, the shape of the spacers 120 may have an L shape.

An interface layer 125, a first high dielectric constant (high-k) layer 131, a diffusion layer 140, a passivation layer 150, and a first metal gate 161 may be sequentially disposed in the first trench 111. In this case, the first high-k layer 131, the diffusion layer 140, the passivation layer 150 and the first metal gate 161 may be configured to extend upward along the sidewall of the first trench 111 as shown in FIG. 1.

The interface layer 125 may serve to prevent a defect interface between the semiconductor substrate 100 and the first high-k layer 131. The interface layer 125 may include a low-k material layer whose dielectric constant (k) is equal to or less than about 9. For example, the interface layer 125 may include a silicon oxide layer (k is about 4) or a silicon oxynitride layer (k is about 4 to 8 according to the content of oxygen atoms and nitrogen atoms). In an embodiment of the inventive concept, the interface layer 125 may be formed of silicate, or may be formed of a combination of the above illustrated layers.

The first high-k layer 131 having a dielectric constant equal to or more than about 10 may be disposed on the interface layer 125. In some embodiments of the inventive concept, the first high-k layer 131 may be formed of, e.g., $HfO_2$, $Al_2O_3$, $ZrO_2$, $TaO_2$ or the like, but the inventive concept is not limited thereto.

The diffusion layer 140 may be formed on the first high-k layer 131. In this embodiment, the diffusion layer 140 may be, e.g., a metal oxide layer. For example, the diffusion layer 140 may be formed of LaO, $Y_2O_3$, $Lu_2O_3$, SrO or a combination thereof, but the inventive concept is not limited thereto. A material (e.g., metal) included in the diffusion layer 140 is diffused into the channel region C of the NFET so that a work function of the NFET may be adjusted. Accordingly, it is possible to improve the performance of the NFET.

Further, the material (e.g., metal) included in the diffusion layer 140 may be diffused into the first high-k layer 131 disposed under the diffusion layer 140. Accordingly, the dielectric constant of the first high-k layer 131 may increase to reduce the gate leakage current of the NFET. Meanwhile, the diffusion layer 140 may prevent metal atoms of the first metal gate 161 from infiltrating into the first high-k layer 131, thereby contributing to improvement of the performance of the NFET. This function of the diffusion layer 140 according to inventive concept will be described in detail later in explaining a method for manufacturing the semiconductor device according to the inventive concept.

In some embodiments of the inventive concept, the diffusion layer 140 may be formed on the first high-k layer 131 to have a first thickness. Here, the first thickness may be about 3 to about 10 Å, but the inventive concept is not limited thereto.

The passivation layer 150 may be disposed on the diffusion layer 140. The passivation layer 150 may prevent the diffusion layer 140 from being oxidized in a manufacturing process to be described later. In this embodiment, the passivation layer 150 may be formed of a metal nitride layer. For example, the passivation layer 150 may be formed of at least one of TiN and TaN. In an embodiment of the inventive concept, the passivation layer 150 may be formed of a single layer of TiN, a double layer including a lower layer of TiN and an upper layer of TaN, or the like, but the inventive concept is not limited thereto.

In some embodiments of the inventive concept, the passivation layer 150 may be formed to have a second thickness larger than a first thickness of the diffusion layer 140. For example, the passivation layer 150 may be formed to have a thickness of about 11 to about 70 Å, but the inventive concept is not limited thereto.

The first metal gate 161 may be disposed on the passivation layer 150. The first metal gate 161 may have a single layer structure formed of a metal layer or a multilayer layer structure formed of a metal nitride layer and a metal layer. The metal layer of the first metal gate 161 may be, e.g., Al, W, Ti or a combination thereof, and the metal nitride of the first metal gate 161 may be TiN, TaN or a combination thereof, but the inventive concept is not limited thereto. In this embodiment, the first metal gate 161 may be formed by using a replacement metal gate (RMG) process. This will be described in detail later in explaining a method for manufacturing the semiconductor device according to an embodiment of the inventive concept.

In some embodiments of the inventive concept, the first metal gate 161 may include an N-type work function layer. The N-type work function layer may be formed of, e.g., TiAl, TiAlN, TaC, TaAlN, TiC, HfSi or the like, but the inventive concept is not limited thereto. The N-type work function layer may be formed to have a thickness of about 30 to about 120 Å, but the inventive concept is not limited thereto.

The PFET may include a second trench 112 disposed on the channel region C of the PFET. Specifically, the second trench 112 may be surrounded by the spacers 120. The interlayer insulating layer 110 may be disposed on the outside of the spacers 120. In some embodiments of the inventive concept, the PFET may include a compressive stress layer (not shown) on the substrate the source/drain regions 102. In an embodiment of the inventive concept, the spacers 120 may have an L shape.

The PFET may include the interface layer 125, a second high dielectric constant (high-k) layer 132, and a second metal gate 162. The layers 125, 132, and 162 may be sequentially disposed in the second trench 112. The second high-k layer 132 and the second metal gate 162 may extend upward along the sidewall of the second trench 112 as shown in FIG. 1. The second high-k film 132 may include substantially the same high-k material as that of the first high-k layer 131.

The second metal gate 162 may be disposed on the second high-k layer 132. The second metal gate 162 may have a single layer structure formed of a metal layer or a multilayer metal layer including a metal nitride layer and a metal layer.

In some embodiments of the inventive concept, the PFET may include the second metal gate 162 which is different from that of the NFET. For example, the first metal gate 161 may include a metal gate having four layers of TiAl/TiN/Ti/Al, and the second metal gate 162 may include a metal gate having four layers of TiN/TaN/TiN/Al, but the inventive concept is not limited thereto.

In some embodiments of the inventive concept, the second metal gate 162 may include a P-type work function layer. The P-type work function layer may be formed to have a thickness of about 50 to about 100 Å, but the inventive concept is not limited thereto.

In some embodiments of the inventive concept, the second metal gate 162 may include both a lower P-type work function layer and an upper N-type work function layer.

Connection wirings (not shown) may electrically connect contacts (not shown) to the NFET and the PFET through the interlayer insulating layer 110.

As described above, the NFET may include the diffusion layer 140 according to embodiments of the inventive concept to improve the performance of the NFET. The PFET may include the P-type work function layer to improve the performance of the PFET.

Hereinafter, an exemplary method for manufacturing the semiconductor device of FIG. 1 will be described below.

FIGS. 2 to 6 illustrate intermediate steps for explaining a method for manufacturing the semiconductor device of FIG. 1 in accordance with an exemplary embodiment of the inventive concept.

Figure 2:
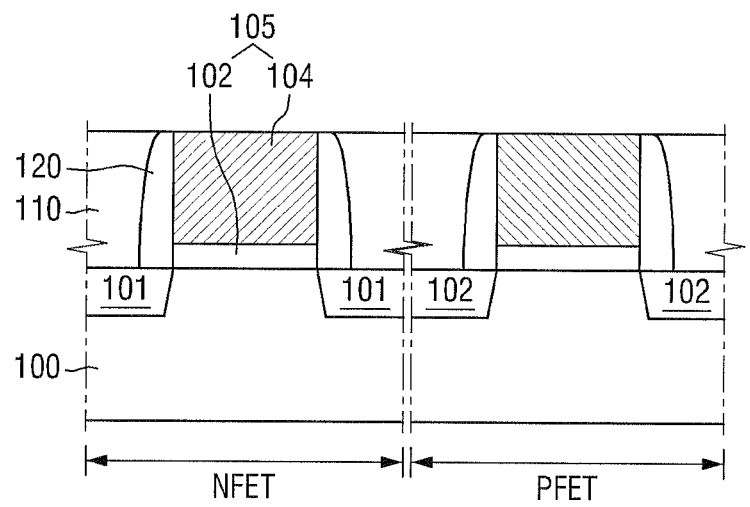
FIGS. 2 to 6 illustrate intermediate steps for explaining a method for manufacturing the semiconductor device of FIG. 1 in accordance with an exemplary embodiment of the inventive concept.

First, referring to FIG. 2, a dummy gate 105 including a gate insulating layer 102 and a first poly gate 104 is formed on the semiconductor substrate 100. Impurities are implanted into the semiconductor substrate 100 using the dummy gate 105 as a mask to form the source and drain regions 101 and 102. Then, the spacers 120 are formed at both sides of the dummy gate 105. The shape of the spacers 120 is not limited to the illustrated shape as described above. For example, the spacers may have L-shaped spacers. The interlayer insulating layer 110 is formed on the semiconductor substrate 100 to cover the dummy gate 105. Then, the interlayer insulating layer 110 is planarized to the level of the upper surface of the dummy gate 105.

Figure 3:
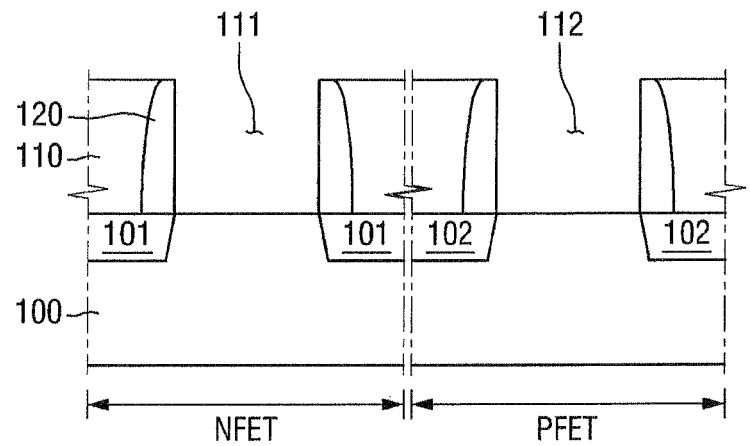

Next, referring to FIG. 3, the dummy gate 105 of is removed. Removing the dummy gate 105 may be performed in various ways including a method of removing the dummy gate 105 in a replacement metal gate (RMG) process. In this way, when the dummy gate 105 of FIG. 2 is removed, the first trench 111 and the second trench 112 are formed.

Figure 4:
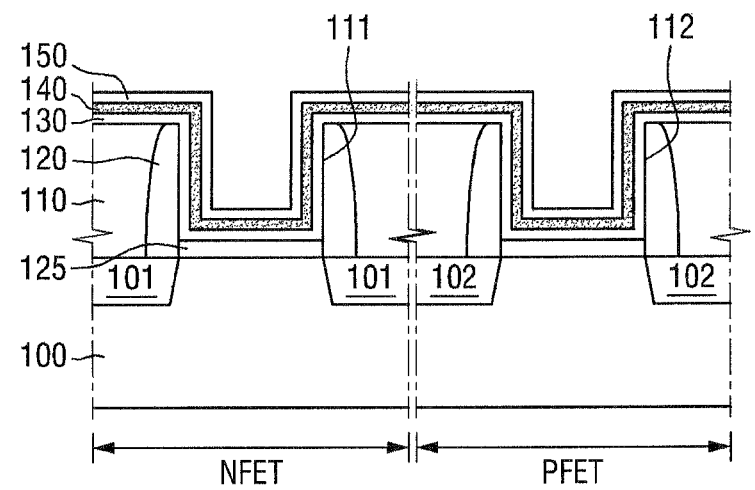

Next, referring to FIG. 4, the interface layer 125 is formed in the first and second trenches 111 and 112. Here, the interface layer 125 may serve to prevent a defect interface between the semiconductor substrate 100 and a high dielectric constant (high-k) layer 130 which will be described later. The interface layer 125 may include a low-k material layer whose dielectric constant (k) is equal to or less than about 9. For example, the interface layer 125 may be formed of a silicon oxide layer (k is about 4) or a silicon oxynitride layer (k is about 4 to 8 according to the content of oxygen atoms and nitrogen atoms in the layer). In an embodiment of the inventive concept, the interface layer 125 may be formed of silicate, or may be formed of a combination of the layers illustrated above layer.

Subsequently, the high-k layer 130, the diffusion layer 140 and the passivation layer 150 are sequentially formed in the first and second trenches 111 and 112. In this embodiment, the diffusion layer 140 may be formed a metal oxide layer, and the passivation layer 150 may be formed of a metal nitride layer. For example, the diffusion layer 140 may be formed of LaO and the passivation layer 150 may be formed of TiN. In some embodiments, the diffusion layer 140 may be formed of LaO, $Y_2O_3$, $Lu_2O_3$, SrO or a combination thereof, and the passivation layer 150 may be formed of TiN, TaN or a combination thereof.

The diffusion layer 140 may have a thickness of about 3 to 10 Å. The diffusion layer 140 may be formed by chemical vapor deposition (CVD), atomic layer deposition (ALD) or the like. The passivation layer 150 may have a thickness of about 11 to 70 Å using CVD, ALD or the like.

Figure 5:
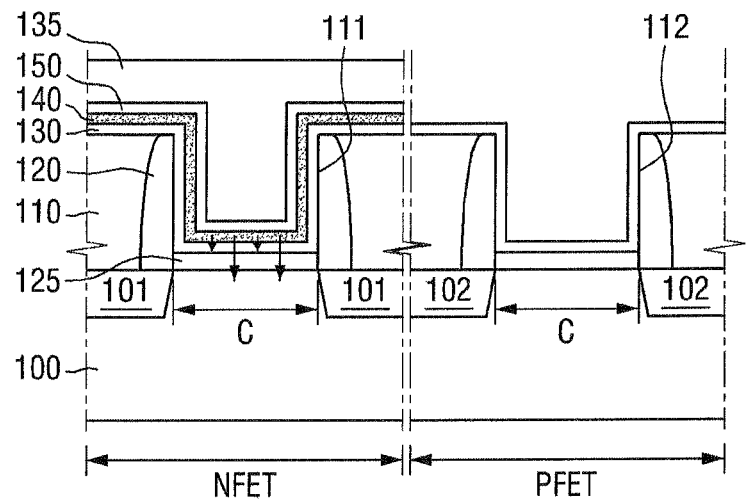

Next, referring to FIG. 5, a polysilicon layer 135 is selectively formed on the first region NFET of the semiconductor substrate 100. Subsequently, the exposed passivation layer 150 and the diffusion layer 140 are sequentially removed. Accordingly, as shown in FIG. 5, the passivation layer 150 and the diffusion layer 140 formed in the second trench 112 may be removed.

Then, the semiconductor substrate 100 is thermally treated. In such thermal treatment, the metal of the diffusion layer 140 formed in the first trench 111 may be diffused into the channel region C of the NFET and the high-k layer 130 formed in the first trench 111. For example, when the diffusion layer 140 is formed of LaO, the La atoms are diffused out of the diffusion layer 140 to the channel region of C and the high-k layer 130 in the first region NFET. Meanwhile, since the diffusion layer 140 is not formed in the second trench 112, the channel region C of the PFET and the high-k layer 130 formed in the second trench 112 are not influenced by the diffusion layer 140 in the thermal treatment.

As described above, the atoms of the diffusion layer 140 diffused into the high-k layer 130 formed in the first trench 111 may increase the dielectric constant of the high-k layer 130 formed in the first trench 111. Further, the La atoms of the diffusion layer 140 diffused into the channel region C of the NFET may adjust a work function of the NFET to improve the performance of the NFET. The metal atoms diffused may not be limited to La atoms, but when the diffusion layer 140 is formed of other metal oxides layer, other metal atoms included in the metal oxides layer may be diffused in the thermal treatment.

Metal atoms diffused from diffusion layer 140 into high-k layer 130 may generate positive charges in the high-k layer 130. Such positive charges attract negative charges generated in N-channel region, and threshold voltage of N-channel transistor may be lowered.

In an exemplary embodiment of the inventive concept, the passivation layer 150 may prevent the diffusion layer 140 from being oxidized in the thermal treatment. When the polysilicon layer 135 is formed on the passivation layer 150, the passivation layer 150 may serve to prevent the diffusion film 140 from being oxidized from oxygens which may diffuse through the polysilicon film 135 in the thermal treatment.

Next, the polysilicon layer 135 formed on the first region NFET of the semiconductor substrate 100 is removed by ashing or the like. Then, TiAl, TiN, Ti and Al layers are sequentially formed on the passivation layer 150. Using an Al CMP process, the first metal gate 161 shown in FIG. 1 may be formed. However, the first metal gate 161 of FIG. 1 according to an exemplary embodiment is not limited thereto, but may be modified according to design choice. In an embodiment of the inventive concept, the first metal gate 161 may include the N-type work function layer to adjust the work function of the first metal gate 161.

The second metal gate of FIG. 1 may be formed by forming TaN, TiN and Al layers sequentially on the high-k layer 130 of FIG. 5 formed in the second trench 112. An Al CMP process may be performed to form the second metal gate 162. The second metal gate 162 may also include the P-type work function layer or a two layer work function layer including a P-type work function layer and an N-type work function layer disposed on the P-type work function layer to improve the performance of the PFET as described above.

After the formation of the first and second metal gates 161 and 162 is completed, connection wirings may be formed. The connection wirings may connect contacts to the NFET and the PFET through the interlayer insulating layer 110.

Hereinafter, a method for manufacturing the semiconductor device of FIG. 1 in accordance with an exemplary embodiment of the inventive concept will be described with reference to FIGS. 2-4 and 6.

As shown in FIGS. 2 to 4, the semiconductor substrate 100 includes the first and second trenches 111 and 112 formed in the first region NFET and the second region PFET, respectively. The interface layer 125, the high-k layer 130, the diffusion layer 140 and the passivation layer 150 are sequentially formed in the first and second trenches 111 and 112. Since these processes have been described above, further description will be omitted here.

Figure 6:
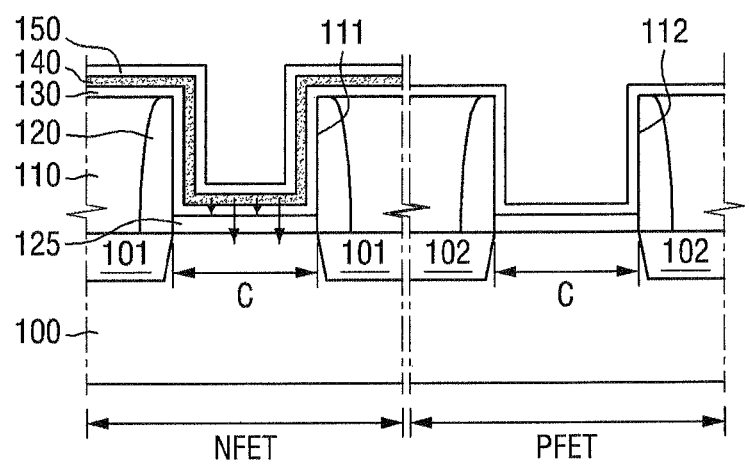

Referring to FIG. 6, a polysilicon layer (not shown) is selectively formed on the first region NFET of the semiconductor substrate 100. The exposed passivation layer 150 and the diffusion layer 140 formed in the second trench 112 are sequentially removed. The polysilicon layer (not shown) formed on the first region NFET of the semiconductor substrate 100 is removed by ashing or the like.

Then, the semiconductor substrate 100 is thermally treated. While the semiconductor substrate 100 is thermally treated, the material (e.g., metal) included in the diffusion layer 140 formed in the first trench 111 may be diffused into the channel region C of the NFET and the high-k layer 130 formed in the first trench 111.

At this time, since the polysilicon layer 135 of FIG. 5 is not formed on the first region NFET of the semiconductor substrate 100, the passivation layer 150 may be exposed to the ambient environment including oxygen. Accordingly, in this case, the passivation layer 150 may prevent the oxygen content of the diffusion layer 140 from being changed due to the oxygen from the ambient environment in the thermal treatment.

Then, since forming the first metal gate 161 in the first trench 111 and forming the second metal gate 162 in the second trench 112 are the same as described above, further description will be omitted.

Next, a semiconductor device in accordance with an exemplary embodiment of the inventive concept will be described with reference to FIG. 7.

Figure 7:
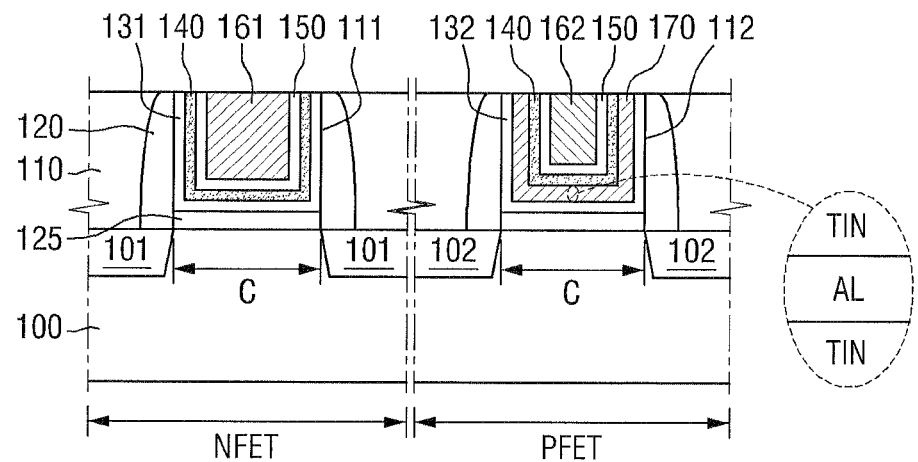
FIG. 7 is a cross-sectional view of a semiconductor device in accordance with an exemplary embodiment of the inventive concept.

FIG. 7 is a cross-sectional view of a semiconductor device in accordance with an exemplary embodiment of the inventive concept. The semiconductor device of FIG. 7 may have similar structure of that of FIG. 1 except a PFET. The following description will focus on that difference.

Referring to FIG. 7, the diffusion layer 140 and the passivation layer 150 may be sequentially formed in the second trench 112 of the semiconductor device of the second embodiment, similarly to the first trench 111. However, in this embodiment, a diffusion barrier layer 170 for preventing the diffusion of the diffusion layer 140 may be additionally formed below the diffusion layer 140 formed in the second trench 112.

The diffusion barrier layer 170 may be formed to extend upward along the sidewall of the second trench 112 as shown in FIG. 7. The diffusion barrier layer 170 may serve to prevent metal of the diffusion layer 140 formed of, e.g., a metal oxide layer from being diffused into the second high-k layer 132 or the channel region C of the PFET. Accordingly, in the semiconductor device according to an exemplary embodiment of the inventive concept, differently from the above-described embodiment, the diffusion layer 140 and the passivation layer 150 are sequentially formed also in the second trench 112, but the same effect as that of the above-described embodiment may be obtained due to the presence of the diffusion barrier layer 170.

In some embodiments of inventive concept, the diffusion barrier layer 170 may include a P-type work function layer. A metal nitride layer may be mentioned as an example of the diffusion barrier layer 170. Specifically, the diffusion barrier layer 170 may be formed of, e.g., TiN, but the inventive concept is not limited thereto. Further, in some other embodiments of the inventive concept, the diffusion barrier layer 170 may have a double layer structure including a metal nitride layer and a metal layer. Specifically, the diffusion barrier layer 170 may have a double layer structure including, e.g., TiN and Al, but the inventive concept is not limited thereto. In some other embodiments of the inventive concept, the diffusion barrier layer 170 may have a three-layer layer structure including, e.g., a first metal nitride layer, a metal layer and a second metal nitride layer. Specifically, the diffusion barrier layer 170 may have a three-layer layer structure including, e.g., TiN, Al and TiN, but the inventive concept is not limited thereto. The diffusion barrier layer 170 may have a thickness of e.g., 1 to 100 Å, but the inventive concept is not limited thereto.

Hereinafter, a method for manufacturing the semiconductor device in accordance with an exemplary embodiment of the inventive concept will be described.

Figure 8:
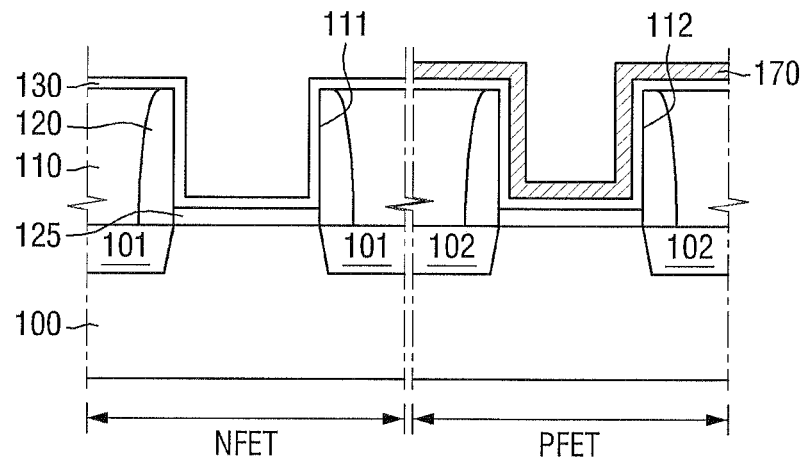
FIGS. 8 to 10 illustrate intermediate steps for explaining the method for manufacturing the semiconductor device in accordance with the exemplary embodiment of the inventive concept.
Figure 9:
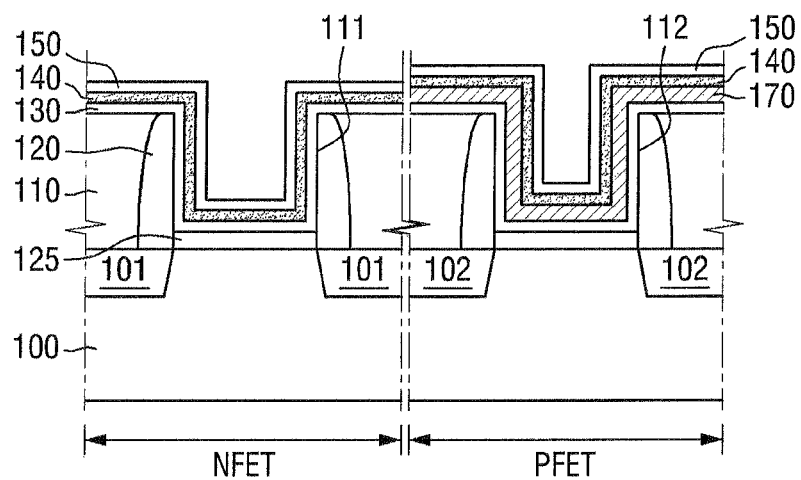
Figure 10:
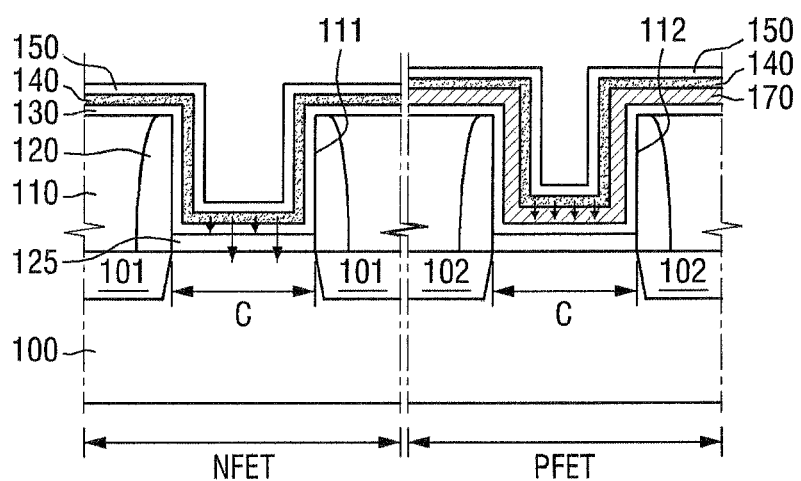

FIGS. 8 to 10 illustrate intermediate steps for explaining the method for manufacturing the semiconductor device in accordance with the exemplary embodiment of the inventive concept.

First, as shown in FIG. 3, the first trench 111 is formed in the first region NFET of the semiconductor substrate 100, and the second trench 112 is formed in the second region PFET of the semiconductor substrate 100. Since this has been described sufficiently in the above, a repeated description will be omitted.

Then, referring to FIG. 8, the interface layer 125 is formed in the first and second trenches 111 and 112. Then, the high-k layer 130 and the diffusion barrier layer 170 are sequentially formed in the first and second trenches 111 and 112 by CVD, ALD or the like.

In an exemplary embodiment of the inventive concept, the diffusion barrier layer 170 may include a P-type work function layer. For example, the diffusion barrier layer 170 may be formed of TiN, but the inventive concept is not limited thereto.

In an embodiment of the inventive concept, the diffusion barrier layer 170 may have a double layer structure including a metal nitride layer and a metal layer. For example, the metal nitride layer is formed of TiN and the metal layer is formed of Al, but the inventive concept is not limited thereto.

In an embodiment of the inventive concept, the diffusion barrier layer 170 may have a three-layer structure including a first metal nitride layer, a metal layer and a second metal nitride layer. For example, the first and the second metal nitrides are formed of TiN, and the metal is formed of Al, but the inventive concept is not limited thereto. The diffusion barrier layer 170 may have a thickness of about 1 to 100 Å, but the inventive concept is not limited thereto.

Then, after masking the second region PFET of the semiconductor substrate 100, the diffusion barrier layer 170 formed on the first region NFET of the semiconductor substrate 100 is selectively removed. As a result, the diffusion barrier layer 170 may exist in the second trench 112, but may not exist in the first trench 111.

Then, referring to FIG. 9, the diffusion layer 140 and the passivation layer 150 are sequentially formed in each of the first trench 111 and the second trench 112 by CVD, ALD or the like. In this case, the diffusion layer 140 may be formed to have a thickness of about 3 to 10 Å, and the passivation layer 150 may be formed to have a thickness of about 11 to 70 Å. Accordingly, the diffusion barrier layer 170 is not formed under the diffusion layer 140 formed in the first trench 111, and the diffusion barrier layer 170 may be formed under the diffusion layer 140 formed in the second trench 112.

Then, referring to FIG. 10, the semiconductor substrate 100 in which the diffusion layer 140 and the passivation layer 150 are formed respectively in the first trench 111 and the second trench 112 is thermally treated. In this case, since the diffusion barrier layer 170 is formed under the diffusion layer 140 formed in the second trench 112, the material (e.g., metal) included in the diffusion layer 140 is not diffused into the channel region C of the PFET or the high-k layer 130 formed in the second trench 112. Accordingly, the material (e.g., metal) included in the diffusion layer 140 is selectively diffused into only the channel region C of the NFET and the high-k layer 130 formed in the first trench 111 as shown in FIG. 10.

Then, referring to FIG. 7, the first metal gate 161 is formed on the passivation layer 150 formed in the first trench 111. Also, the second metal gate 162 is formed on the passivation layer 150 formed in the second trench 112. Since this has been described sufficiently in the above, a repeated description will be omitted.

Next, a semiconductor device in accordance with an exemplary embodiment of the inventive concept will be described with reference to FIG. 11.

Figure 11:
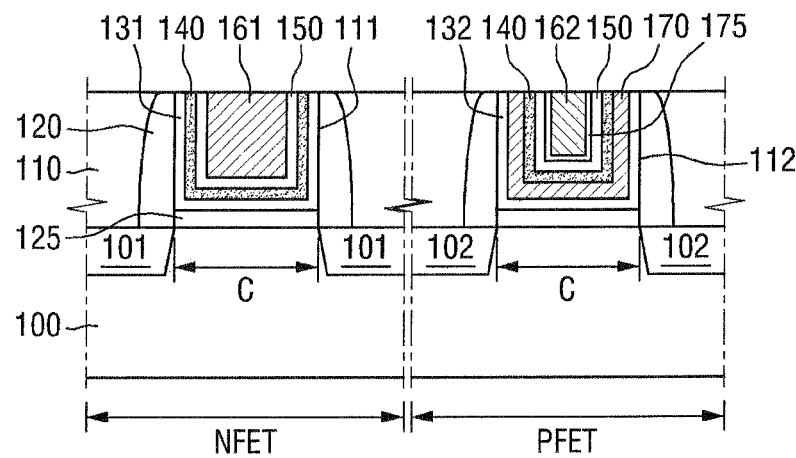
FIG. 11 is a cross-sectional view of a semiconductor device in accordance with the exemplary embodiment of the inventive concept.

FIG. 11 is a cross-sectional view of a semiconductor device in accordance with the exemplary embodiment of the inventive concept. The semiconductor device of FIG. 11 is substantially the same structure as that of FIG. 7 except that the PFET of FIG. 11 further includes a cobalt layer 175. The following description will focus on the difference.

Referring to FIG. 11, a cobalt layer 175 may be further formed under the second metal gate 162 formed in the second trench 112 of the semiconductor device according to the exemplary embodiment. The cobalt layer 175 may improve metal-fill characteristics of the metal gate 162 when the metal gate 162 is formed on the cobalt layer 175. For example, when the second metal gate 162 is formed on the cobalt layer 175, the metal gate 162 may fill in the trench 112 without forming a void. Accordingly, the second metal gate 162 may be formed more reliably in the second trench 112.

The cobalt layer 175 may be formed on the passivation layer 150 by CVD or the like. In this case, the thickness of the cobalt layer 175 may be about 1 to 20 Å, but the inventive concept is not limited thereto.

Next, a semiconductor device in accordance with an exemplary embodiment of the inventive concept will be described with reference to FIG. 12. The semiconductor device of FIG. 12 may have substantially the same structure as that of FIG. 7 except for a PFET. The following description will focus on this difference.

Figure 12:
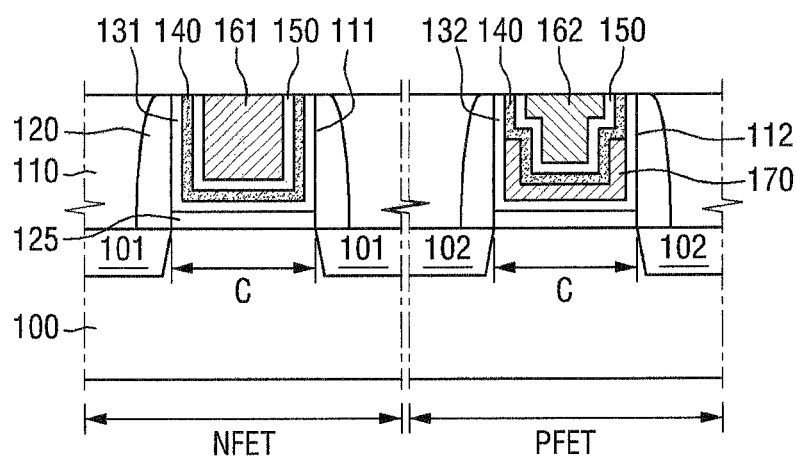
FIG. 12 is a cross-sectional view of a semiconductor device in accordance with an exemplary embodiment of the inventive concept.

Referring to FIG. 12, the diffusion barrier layer 170 may be disposed on a second high dielectric constant (high-k) layer 132 in the second trench 112. The diffusion barrier layer 170 may have a U shape which partially covers the lower portion of the second high-k layer 132, so the upper portion of the second high-k layer 132 is not covered with the U shape diffusion barrier layer 170. For example, the ends of the U shape diffusion barrier layer 170 are positioned lower than the upper surface of the PFET.

The U shape diffusion barrier layer 170 may improve the metal-fill characteristics of a metal gate 162 because the metal gate 162 is formed in the trench 112. to be formed on the diffusion barrier layer 170. Accordingly, since the metal-fill characteristics are improved when the second metal gate 162 is formed on the diffusion barrier layer 170 as illustrated, the second metal gate 162 may be formed more reliably in the second trench 112.

Next, a semiconductor device in accordance with an exemplary embodiment of the inventive concept will be described with reference to FIGS. 13 to 15.

Figure 13:
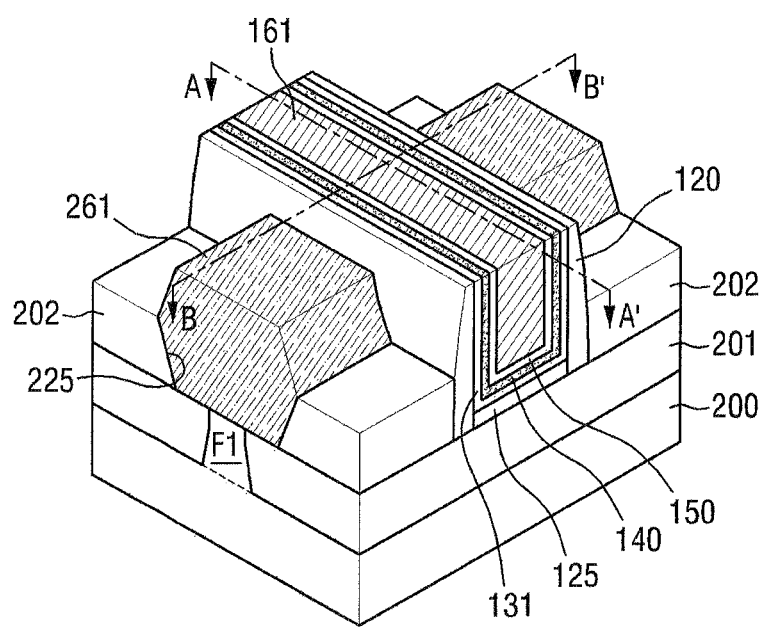
FIG. 13 is a diagram for explaining a fin-type transistor (FinFET) in accordance with an exemplary embodiment of the inventive concept.

FIG. 13 is a diagram for explaining a fin-type transistor (FinFET) in accordance with an exemplary embodiment of the inventive concept. FIG. 14 is a cross-sectional view taken along line A-A' of FIG. 13. FIG. 15 is a cross-sectional view taken along line B-B' of FIG. 13. FIGS. 13 to 15 illustrate a fin-type transistor (FinFET) including the metal gate of the NFET of FIG. 1 in accordance with an exemplary embodiment of the inventive concept.

Figure 14:
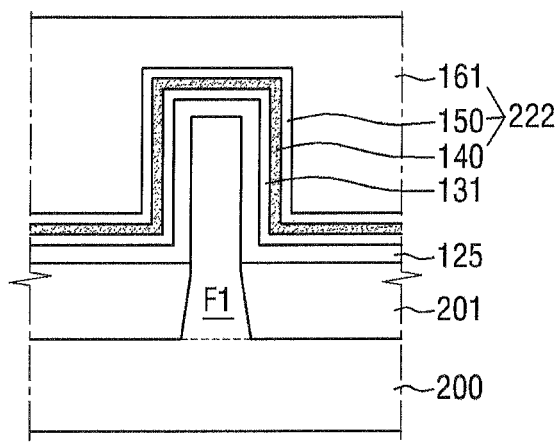
FIG. 14 is a cross-sectional view taken along line A-A' of FIG. 13.
Figure 15:
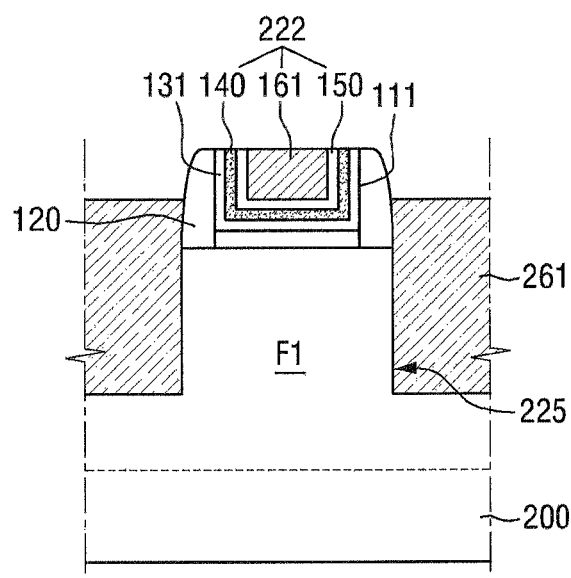
FIG. 15 is a cross-sectional view taken along line B-B' of FIG. 13.

Referring to FIGS. 13 to 15, the FinFET may include a fin F1, a gate electrode 222, a recess 225, and a source/drain 261.

The fin F1 may extend in a second direction Y1. The fin F1 may be a portion of a substrate 200 and may include an epitaxial layer grown from the substrate 200. An isolation 201 may cover the side surface of the fin F1.

The gate electrode 222 may be disposed on the fin F1, extending in a first direction X1. The gate electrode 222 formed on the first high-k layer 131 and the interface layer 125 may include the diffusion layer 140, the passivation layer 150, and the first metal gate 161.

The recess 225 may be formed in a first interlayer insulating layer 202 at both sides of the gate electrode 222. The sidewall of the recess 225 is inclined and the shape of the recess 225 may be widened as it goes farther away from the substrate 100. Meanwhile, as shown in FIG. 13, the width of the recess 225 may be larger than the width of the fin F1.

The source/drain 261 may be formed in the recess 225. The source/drain 261 may have an elevated shape. For example, the upper surface of the source/drain 261 may be higher than the upper surface of the isolation 201. Further, the source/drain 261 and the gate electrode 222 may be isolated from each other by the spacers 120.

The source/drain 261 may include the same material as that of the substrate 200. For example, when the substrate 200 includes Si, the source/drain 261 may be formed of Si. In an embodiment, the source/drain 261 of the NFET may be formed of a material having tensile stress for NFET. For example, when the substrate 200 includes Si, the source/drain 261 may include SiC having a lattice constant smaller than that of Si. The tensile stress may improve the mobility of carriers of the channel region of the fin F1.

Figure 17:
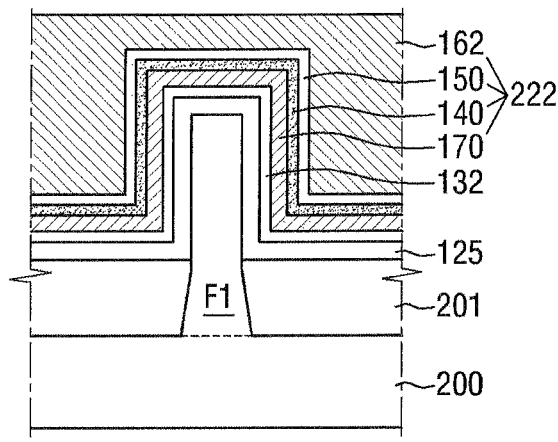
FIG. 17 is a cross-sectional view taken along line C-C' of FIG. 16.
Figure 18:
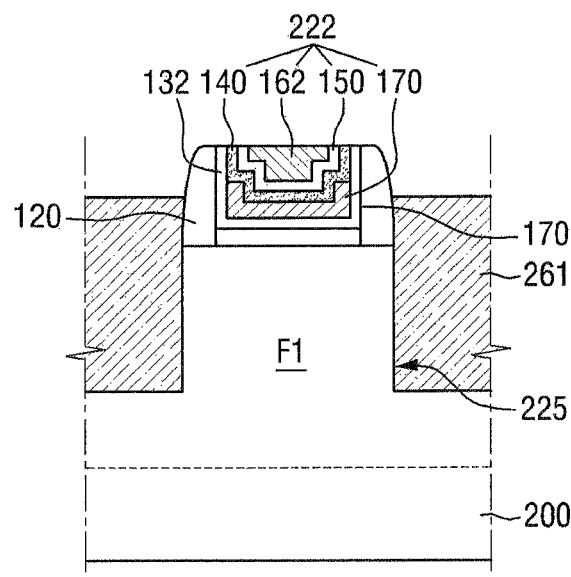
FIG. 18 is a cross-sectional view taken along line D-D' of FIG. 16.

Next, a semiconductor device in accordance with an exemplary embodiment of the inventive concept will be described with reference to FIGS. 16 to 18.

Figure 16:
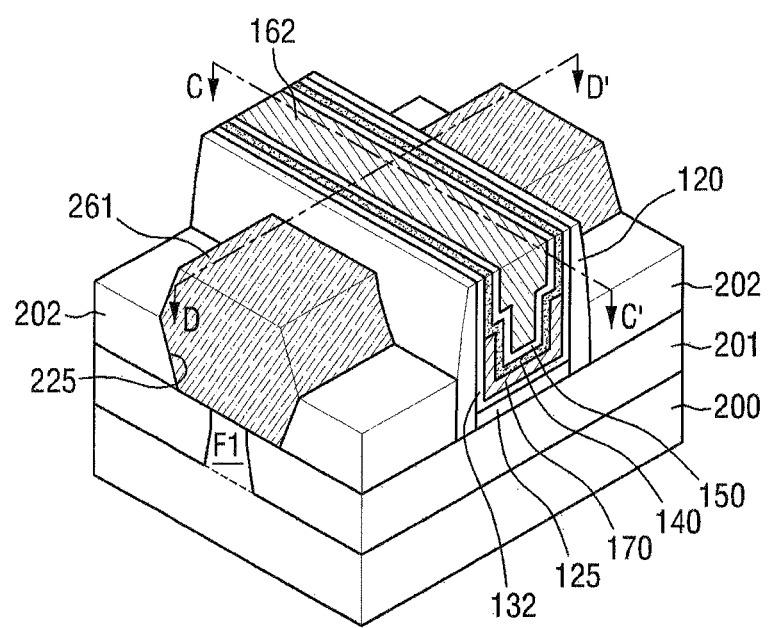
FIG. 16 is a diagram for explaining a fin-type transistor (Fin-FET) in accordance with the embodiment of the inventive concept.

FIG. 16 is a diagram for explaining a fin-type transistor (Fin-FET) in accordance with the embodiment of the inventive concept. FIG. 17 is a cross-sectional view taken along line C-C' of FIG. 16. FIG. 18 is a cross-sectional view taken along line D-D' of FIG. 16. FIGS. 16 to 18 illustrate the gate of the PFET shown in FIG. 12 applied to a fin-type transistor (Fin-FET). The semiconductor device of FIG. 16 is substantially the same structure as that of the FIG. 13 except that the gate of PFET of FIG. 12 is applied to FinFET. The gate of PFET of FIG. 12 was explained above with reference to FIG. 12, and further description is omitted here.

For the PFET, the source/drain 261 may include a material having compressive stress. For example, the substrate 200 includes Si, the source/drain 261 may be formed of SiGe having a lattice constant larger than that of Si. The compressive stress may improve the mobility of carriers of the channel region of the fin F1.

Next, a semiconductor device in accordance with an exemplary embodiment of the inventive concept will be described with reference to FIGS. 19 to 21.

Figure 19:
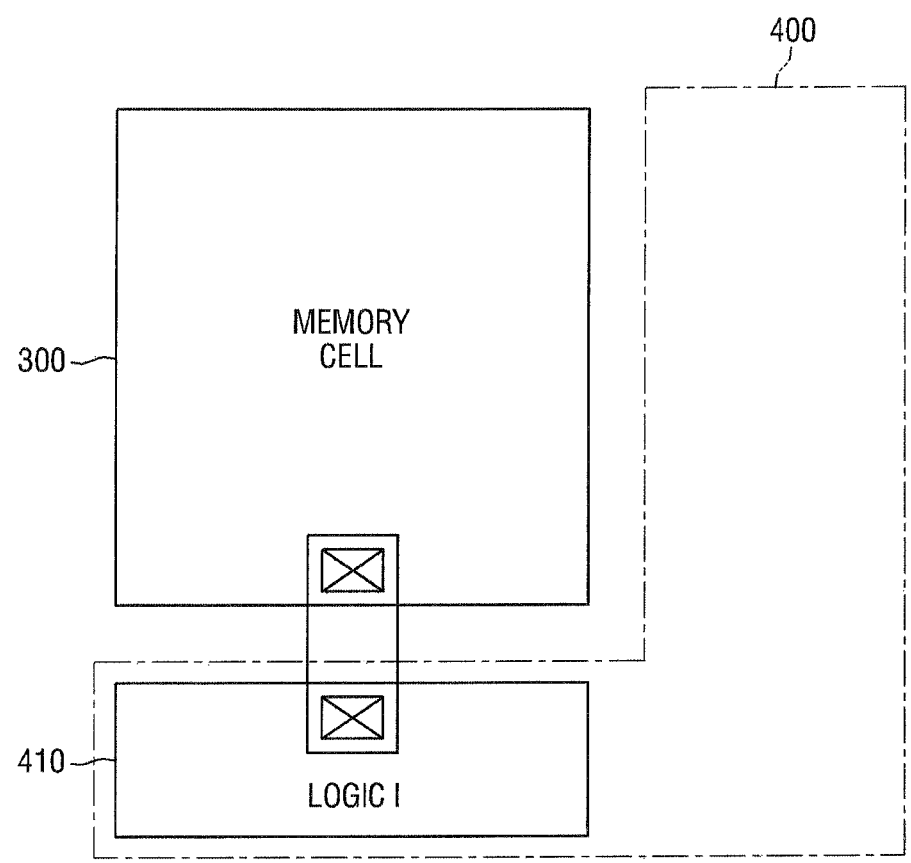
FIG. 19 is a layout of the semiconductor device in accordance with an exemplary embodiment of the inventive concept.

FIG. 19 is a layout of the semiconductor device in accordance with an exemplary embodiment of the inventive concept. FIG. 20 is a circuit diagram of a static random access memory (SRAM) cell of the semiconductor device of FIG. 19. FIG. 21 is a cross-sectional view of a NFET and a PFET of the SRAM cell and a PFET of a logic region 410 of the semiconductor device of FIG. 20 according an exemplary embodiment of the invention.

Referring to FIG. 19, the semiconductor device may include a memory region 300 and a peripheral region 400. The memory region 300 may be, e.g., a region where a memory device is formed, and the peripheral region 400 may be, e.g., a region where a peripheral circuit device is formed.

Figure 20:
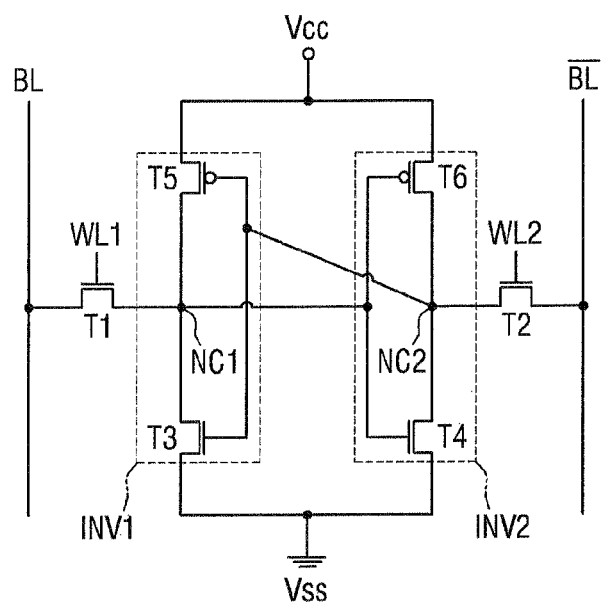
FIG. 20 is a circuit diagram of a static random access memory (SRAM) cell of the semiconductor device of FIG. 19.
Figure 21:
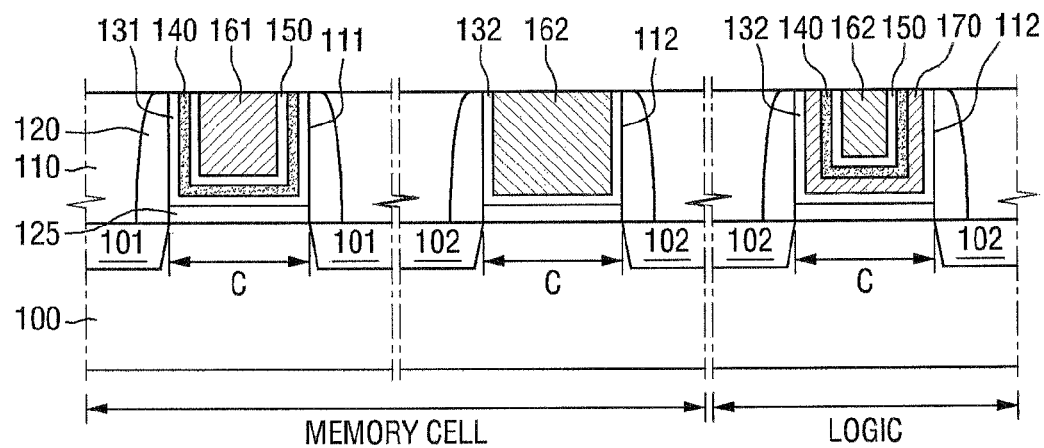
FIG. 21 is a cross-sectional view of a NFET and a PFET of the SRAM cell and a PFET of a logic region of the semiconductor device of FIG. 20 according an exemplary embodiment of the invention.

In an exemplary embodiment of the inventive concept, an SRAM cell of FIG. 20 may be formed in the memory region 300. Referring to FIG. 20, the memory device may include a pair of inverters INV1 and INV2 connected in parallel between a power supply node Vcc and a ground node Vss, and a first transmission transistor T1 and a second transmission transistor T2 respectively connected to output nodes of the inverters INV1 and INV2. The first transmission transistor T1 and the second transmission transistor T2 may be connected to a bit line BL and a complementary bit line BL/, respectively. The gates of the first transmission transistor T1 and the second transmission transistor T2 may be connected to word lines WL1 and WL2, respectively.

The first inverter INV1 may include a first load transistor T5 and a first drive transistor T3 which are connected in series. The second inverter INV2 may include a second load transistor T6 and a second drive transistor T4 which are connected in series. Further, the first inverter INV1 and the second inverter INV2 are configured such that the input node of the first inverter INV1 is connected to the output node NC2 of the second inverter INV2 and the input node of the second inverter INV2 is connected to the output node NC1 of the first inverter INV1, thereby forming a latch circuit.

Here, at least one of the first load transistor T5 and the second load transistor T6 may be formed of the P-type field effect transistor (PFET) according to the exemplary embodiments of the inventive concept. Further, at least one of the first transmission transistor T1, the second transmission transistor T2, the first drive transistor T3 and the second drive transistor T4 may be formed of the N-type field effect transistor (NFET) according to the exemplary embodiments of the inventive concept.

In some embodiments of the inventive concept, the peripheral region 400 may include, e.g., an input/output (I/O) region. The peripheral region 400 may be a lower density one than the memory region 300, and distance between transistors larger than that of the memory region 300. The peripheral region 400 may include a logic region 410. Further, a P-type field effect transistor (PFET) according to the embodiments of the inventive concept may be formed in the logic region 410.

For example, the semiconductor device of FIG. 19 may include the NFET and PFET of FIG. 1 as part of the SRAM cell in the memory region 300. The semiconductor device also includes the PFET of FIG. 7 for the peripheral circuit device in the logic region 410.

Figure 22:
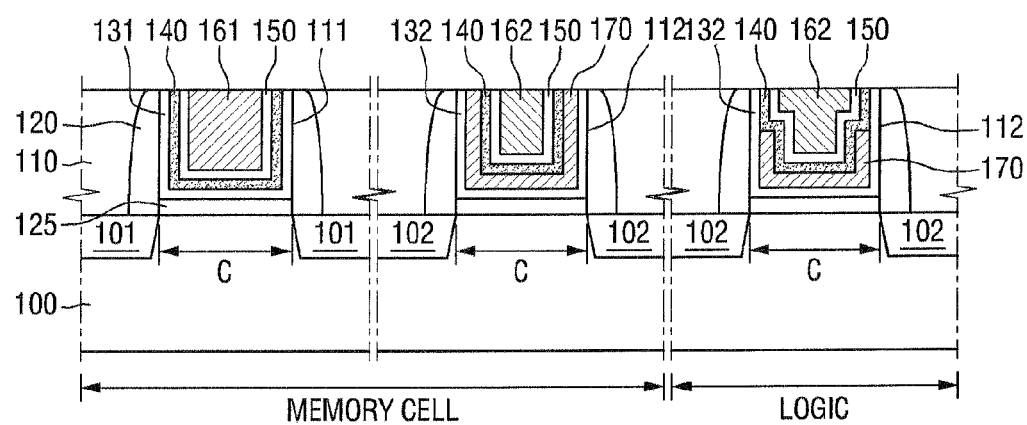
FIG. 22 is a cross-sectional view of a NFET and a PFET of the SRAM cell and a PFET of a logic region of the semiconductor device of FIG. 20 according an exemplary embodiment of the invention.

Next, a semiconductor device in accordance with an exemplary embodiment of the inventive concept will be described with reference to FIGS. 19, 20, and 22. In this exemplary embodiment, the NFET and PFET of FIG. 7 may be formed as the SRAM cell in the memory region 300, and the PFET of FIG. 12 may be formed for the peripheral circuit device in the logic region 410. However, the inventive concept is not limited thereto, and the above-described embodiments may be combined to a semiconductor device.

Next, a semiconductor device in accordance with an exemplary embodiment of the inventive concept will be described with reference to FIGS. 23 and 24.

Figure 23:
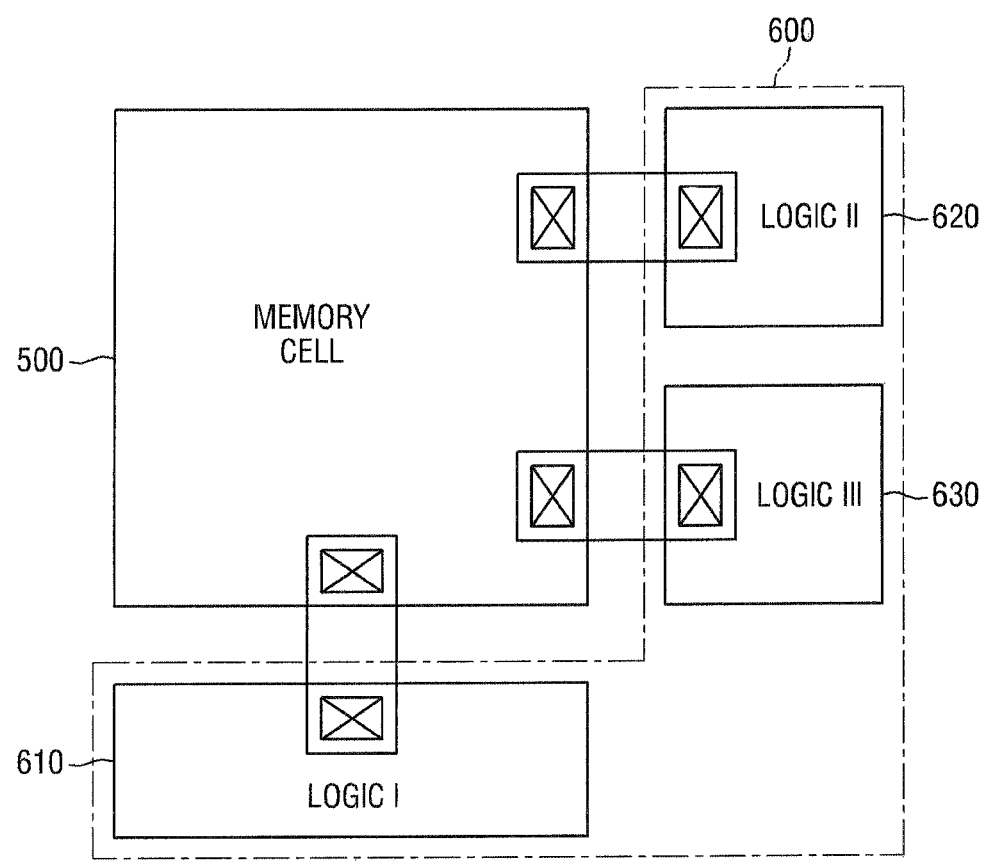
FIG. 23 is a layout of a semiconductor device in accordance with an exemplary embodiment of the inventive concept.

FIG. 23 is a layout of a semiconductor device in accordance with an exemplary embodiment of the inventive concept. FIG. 24 is a cross-sectional view of the semiconductor device of the semiconductor device of FIG. 23.

Figure 24:
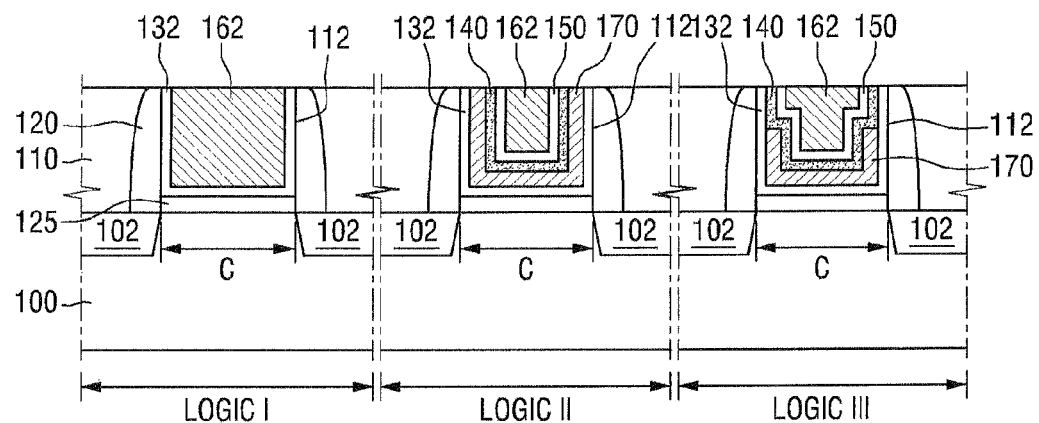
FIG. 24 is a cross-sectional view of the semiconductor device of the semiconductor device of FIG. 23.

Referring to FIGS. 23 and 24, the semiconductor device may include a memory region 500 and a peripheral region 600. In this case, the peripheral region 600 may include first to third logic regions 610 to 630.

In this embodiment, the FETs according to the embodiments of the inventive concept may be formed in the logic regions 610 to 630. For example, the PFET of FIG. 1 may be formed in the first logic region 610, the PFET of FIG. 7 may be formed in the second logic region 620, and the PFET of FIG. 12 may be formed in the third logic region 630. However, the inventive concept is not limited thereto, and the first to third logic regions 610 to 630 may include a different combination of the PFETs according to the above-described embodiments.

Figure 25:
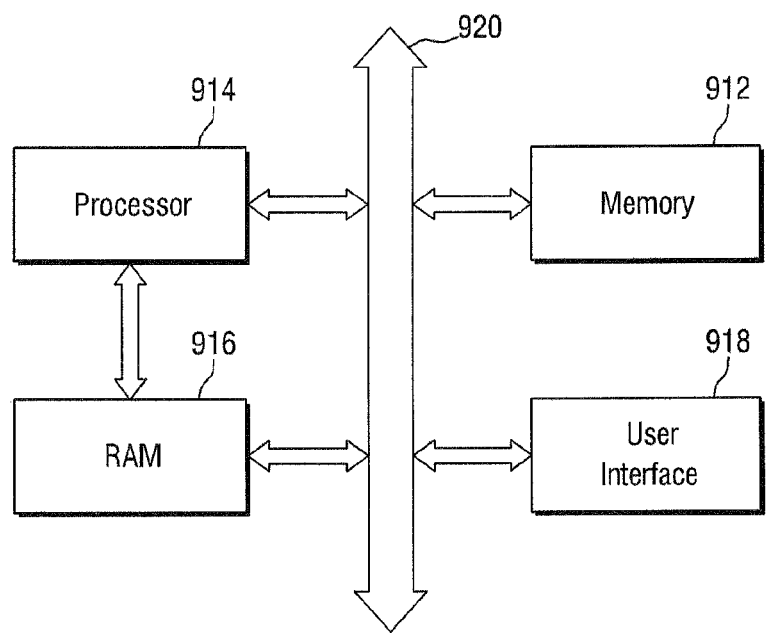
FIG. 25 is a block diagram of an electronic system including a semiconductor device according to an embodiment of the inventive concept.

FIG. 25 is a block diagram of an electronic system including a semiconductor device according to an embodiment of the inventive concept.

Referring to FIG. 25, the electronic system 900 may include a memory system 912, a processor 914, a RAM 916 and a user interface 918. For example, the electronic system 900 may be a mobile apparatus, computer or the like.

The memory system 912, the processor 914, the RAM 916 and the user interface 918 may communicate with each other through a bus 920. The processor 914 may control the electronic system 900. The RAM 916 may be used as an operating memory of the processor 914.

For example, the processor 914, the RAM 916 and/or the memory system 912 may include the semiconductor device according to the embodiments of the inventive concept. Further, in some embodiments of the inventive concept, the processor 914 and the RAM 916 may be packaged together in the same package.

The user interface 918 may be used to input/output data to/from the electronic system 900. The memory system 912 may store data processed by the processor 914, or data inputted from the outside. The memory system 912 may include a controller and a memory.

While the inventive concept has been shown and described with reference to exemplary embodiments thereof, it will be apparent to those of ordinary skill in the art that various changes in form and detail may be made therein without departing from the sprit and scope of the inventive concept as defined by the following claims.

What is claimed is:

1. A semiconductor device comprising a N-type field effect transistor, the N-type field effect transistor comprising:
    a first high dielectric constant (high-k) layer disposed on a substrate;
    a first diffusion layer including a metal oxide disposed on the first high-k layer;
    a first passivation layer disposed on the first diffusion layer; and
    a first metal gate disposed on the first passivation layer,
    wherein the metal oxide is at least one of $Y_2O_3$, $Lu_2O_3$, and SrO.

2. The semiconductor device of claim 1, wherein the first passivation layer includes a metal nitride layer for preventing the first diffusion layer from being oxidized.

3. The semiconductor device of claim 2, wherein the metal nitride layer includes at least one of TiN and TaN.

4. The semiconductor device of claim 1, wherein the first diffusion layer has a thickness of about 3 to about 10 Å.

5. The semiconductor device of claim 1, wherein the first passivation layer has a thickness of about 11 to about 70 Å.

6. The semiconductor device of claim 1, wherein the first metal gate includes a N-type work function layer having a thickness of about 30 to about 120 Å.

7. The semiconductor device of claim 1, wherein the N-type field effect transistor further comprises a first interface layer disposed between the high-k layer and the substrate, wherein the first interlace layer has a dielectric constant less than that of the high-k layer.

8. The semiconductor device of claim 1 further comprising a P-type field effect transistor comprising a second high dielectric constant (high-k) layer disposed on the substrate.

9. The semiconductor device of claim 8, wherein the P-type field effect transistor further comprising:
    a diffusion barrier layer formed on the second high-k;
    a second diffusion layer disposed on the diffusion barrier layer;
    a second passivation layer disposed on the second diffusion layer; and
    a second metal gate disposed on the second passivation wherein the diffusion barrier layer prevents metal atoms of the second diffusion layer from being diffused into the second high-k layer and the substrate.

10. The semiconductor device of claim 8, wherein the first high-k layer includes substantially the same high-k material as that of the second high-k layer.

11. The semiconductor device of claim 9, wherein the diffusion barrier layer includes a metal nitride layer and a metal layer.

12. The semiconductor device of claim 11, wherein the metal nitride layer includes TiN and the metal layer includes Al.

13. The semiconductor device of claim 11, wherein the diffusion barrier layer has a thickness of about 1 to about 100 Å.

14. The semiconductor device of claim 11, wherein the diffusion barrier layer includes a P-type work function layer having a thickness of about 50 to 100 Å.

15. The semiconductor device of claim 9, wherein the second high-k layer has a U shape whose lower sidewall is covered with the diffusion barrier and whose upper sidewall is covered with the second diffusion layer.

16. A semiconductor device comprising a N-type field effect transistor and a P-type field effect transistor, the N-type field effect transistor comprising:
    a N-channel region in a substrate,
    a first high dielectric constant (high-k) layer disposed on the N-channel region,
    a first diffusion layer including a metal oxide having a metal element disposed on the first high-k layer,
    a first passivation layer disposed on the first diffusion layer, and
    a first metal gate disposed on the first passivation layer,
    wherein the first high-k layer includes metal atoms of the metal element of the metal oxide,
    the P-type field effect transistor comprising:
    a second high-k layer disposed on a P-channel region in the substrate;
    a diffusion barrier layer formed on the second high-k layer disposed on the P-channel region;
    a second diffusion layer including a metal oxide disposed on the diffusion barrier layer,
    a second passivation layer disposed on the second diffusion layer disposed on the diffusion barrier layer, and
    a second metal gate disposed on the second passivation layer over the P-channel region;
    wherein the diffusion barrier layer prevents the metal atoms of the second diffusion layer from being diffused into the second high-k layer,
    wherein the metal element includes at least one of La, Y, Lu and St, and
    wherein the diffusion barrier layer has a U shape of which upper surface is covered with the second diffusion layer.

17. The semiconductor device of claim 16, the metal atoms are diffused from the metal oxide of the first diffusion layer.

* * * * *